United States Patent [19]
Metzler et al.

[11] Patent Number: 5,334,874
[45] Date of Patent: Aug. 2, 1994

[54] ELECTRONIC DEVICE PACKAGE

[76] Inventors: Richard A. Metzler, 28232 Driza, Mission Viejo, Calif. 92692; Mark Kalatsky, 2175 Temple Hills Dr., Laguna Beach, Calif. 92651

[21] Appl. No.: 759,165

[22] Filed: Sep. 13, 1991

[51] Int. Cl.⁵ .................. H01L 23/02; H01J 15/00
[52] U.S. Cl. .................... 257/678; 257/690; 257/698; 257/704; 257/734
[58] Field of Search .................. 357/72, 74, 73; 257/678, 690, 698, 704, 734

[56] References Cited

U.S. PATENT DOCUMENTS

| | | |
|---|---|---|
| 3,381,080 | 4/1968 | Stelmak . |
| 3,501,833 | 3/1970 | Spiegler . |
| 3,512,254 | 5/1970 | Jenkins et al. . |
| 3,648,357 | 3/1972 | Green, Jr. . |
| 4,025,716 | 5/1977 | Morse . |
| 4,649,416 | 3/1987 | Borkowski et al. . |
| 4,698,663 | 10/1987 | Sugimoto et al. . |
| 4,803,546 | 2/1989 | Sugimoto et al. . |
| 4,825,282 | 4/1989 | Fukaya . |
| 4,905,075 | 2/1990 | Temple et al. ............ 357/73 |
| 4,907,067 | 3/1990 | Derryberry . |
| 4,922,325 | 5/1990 | Smeltz, Jr. . |
| 4,931,854 | 6/1990 | Yonemasu et al. . |
| 4,954,877 | 9/1990 | Nakanishi et al. . |
| 4,970,577 | 11/1990 | Ogihara et al. . |
| 4,985,751 | 1/1991 | Shiobara et al. . |
| 4,992,628 | 2/1991 | Beppu et al. . |
| 5,014,115 | 5/1991 | Moser . |

OTHER PUBLICATIONS

"Hughes Microglass Diode with the glass ambient junction", Hughes Product Brochure, Nov. 1961.

*Primary Examiner*—Eugene R. LaRoche
*Assistant Examiner*—Viet Q. Nguyen
*Attorney, Agent, or Firm*—Hecker & Harriman

[57] ABSTRACT

A package for a semiconductor device includes multiple layers which are fused together to encapsulate the device in a package which has a size approaching the size of the unpackaged device. The compact package facilitates heat transfer from the device, thus making it particularly advantageous for high power applications. Electrical contacts with the device are provided as contact pads on the surface of the package. Primary materials used in construction of the package include glass and ceramics, although other materials such as resins and epoxy could also be used. The multiple layers comprising the package are welded or fused together without having any adhesive, solder, etc. between the layers. Thus, the assembly of the package is an efficient one step process wherein electrical and thermal contacts with the electronic device are made simultaneously with the sealing operation.

20 Claims, 5 Drawing Sheets

ELECTRONIC DEVICE PACKAGE

FIELD OF THE INVENTION

The present invention relates to a semiconductor device and, in particular, to a functional electronic element encapsulated within a sealed enclosure.

BACKGROUND OF THE INVENTION

Almost all semiconductor components are enclosed in packages when they are incorporated into a working electronic system. Typically, integrated circuits are enclosed in an appropriate package prior to their sale by the integrated circuit manufacturer.

There are many reasons for providing a proper environment around an integrated circuit. For example, appropriate packaging of an integrated circuit generally results in a dramatic economy in assembly. Integrated circuits chips are extremely small and fragile, and therefore are difficult to handle without the aid of magnifying and manipulating equipment. Placement of a chip into an integrated circuit ("IC") package overcomes the difficulty of handling the chip by providing a relatively large and easily handled package configuration. A second important function fulfilled by IC packages is mechanical protection of the chips. Because the integrated circuit chips are generally made from fragile materials, they must be protected from the possibility of scratches and chipping. A third essential function of an IC package is to shield the enclosed integrated circuit chip from the surrounding environment so as to preclude contamination, corrosion and other detrimental effects resulting from exposure to the normal environment.

The drive toward smaller and smaller system size has lead to the expanding development and use of solid state semiconductor devices and is accompanied by a strong need for a satisfactory miniaturized sealed package or enclosure for semiconductor devices. A limiting factor in further size reduction of electronic systems is the size of the IC package itself, which is generally several times the size and weight of the semiconductor device which it houses. Heretofore, difficulties have been encountered in reducing the package size and thickness while continuing to provide adequate means for making electrical connections to the package and for transferring heat from the semiconductor element to an external heat sink. The attainment of a good hermetic seal for the semiconductor element and particularly at the junction between the walls of the enclosure and the leads projecting externally, and providing suitable external connection arrangements to provide versatility and means of making interconnections and for ease of mounting the device on a supporting structure must be maintained in the smaller sized package. The IC package referred to hereinafter may be employed, for example, for encapsulating semiconductors such as diodes, transistors, integrated circuits and complete functional electronic elements.

Electrical devices such as integrated circuits, electroconductive film resistors, transistors, diodes, semiconductors, and the like are commonly sealed in a container or enclosure having a body of electrically insulating or conducting material. Such bodies are formed with a relatively large planar bottom wall surrounded by a rim defining a cavity within which an electrical device is disposed. Leads extending from within the cavity to the outside of the body are provided. The electrical device is typically connected to these leads within the cavity by wirebonding the connector pads to the leads with extremely small and fragile wires. The wirebonded chip assembly is then enclosed within the cavity by a rigid cover plate disposed over the cavity and sealed to the rim. This type of construction has many drawbacks, the magnitude of which increase as the size of the package decreases. For example, the assembly becomes more and more tedious and time consuming, the package becomes more fragile, and the dissipation of heat from the device becomes more difficult.

SUMMARY OF THE INVENTION

The present invention comprises an apparatus and method for encapsulating a semiconductor device comprising a bottom die attach plate having conductor pads framed by a glass or ceramic material; an apertured glass plate unit; a semiconductor device with solder connector bumps disposed within the aperture so that the solder connector bumps on the device make electrical contact with the conductor pads in the bottom die attach plate; and a top die attach plate having conductor pads framed in a glass or ceramic material so that some of the solder connector bumps on the device make electrical contact with the conductor pads in the top die attach plate.

The present invention provides a new generation of IC packaging which effectively makes it possible to achieve an hermetic package which is typically smaller than a chip-on-board outline. This package provides a chip to package area ratio of better than 2:1, with some designs approaching a chip to package area ratio of 1:1, with a weight of less than one (1) gram. The package of the present invention can be used to mount semiconductor die of virtually any configuration in an hermetic environment capable of withstanding assembly processes in excess of 300° C. without any degradation. The IC package of the present invention also provides vertical, thermal conduction paths from both the top and bottom surfaces of the die, which greatly enhances the power handling and electrical performance characteristics of the resulting packaged device. Devices packaged in accordance with the present invention are able to perform in operating ranges from less than about −65° C. to +200° C., and will withstand in excess of 1000 thermal cycles in this range.

Furthermore, the package of the present invention does not need to contain ferromagnetic materials that could interfere with high frequency operating characteristics. This design provides a completely hermetic environment for the semiconductor device inside, at a minimal cost, capable of being assembled in one step using tried and proven manufacturing techniques, thus reducing the cost of assembly. Compared to conventional techniques, this package provides a significant reduction in packaging costs along with increased packaging performance and technology. The package of the present invention is useable in the surface mount technology arena as well as other high density packaging environments.

In accordance with one embodiment of the present invention an electronic package comprises a first base substrate; an apertured plate which is positioned adjacent the first base substrate to form a cavity. The first base substrate and the apertured plate are fusible directly to each other. Alternatively, the cavity may be formed as an integral part of the first base substrate. A semiconductor device having an electrical contact pad is disposed within the cavity such that the device is substantially enclosed within the cavity leaving substantially no voids in the cavity. A second base substrate is directly fusible to the apertured plate and a substrate conductor path extends from a cavity conductor pad through the first base substrate to an exterior conductor pad. A conducting interconnector between the device electrical contact pad and the cavity conductor pad forms an electrical connection between the semiconductor device and the exterior conductor pad.

The first base substrate may further comprise a ceramic substrate having a film of conducting material deposited on a first surface of the substrate to form the exterior conductor pad and a film of conducting material deposited on a second surface of the substrate to form the cavity conductor pad. A conducting via passing through the substrate from the first surface to the second surface electrically interconnects the exterior conductor pad to the cavity conductor pad.

In certain embodiments, the first base substrate comprises a conducting substrate framed by either a ceramic or glass substrate having an aperture into which the conducting substrate is fused.

A layer of circuitry interposed between the semiconductor device and the external conductor pad is advantageous for many applications of the invention.

The present invention provides an IC package for a semiconductor device with an electrical connector pad. A body member, having an interior chamber of substantially the identical shape and size of the semiconductor device encapsulates the semiconductor device within the chamber with substantially no voids. A conducting path extends from an exterior surface of the body member to a chamber electrical connector pad on an interior surface of the chamber and an electrical connector bump is sandwiched between the chamber electrical connector pad and the electrical connector pad on the semiconductor device.

In some embodiments, a circuit member is interposed between the semiconductor device electrical connector pad and the conducting path extending from the body member exterior surface.

In accordance with the invention there is provided an IC package for a semiconductor device having contact pads on a contact pad surface having a contact pad surface area, i.e., a device footprint. The semiconductor device is encased in a voidless capsule having electrical contact pads on an exterior mounting surface having a mounting area, i.e., a package footprint, which is less than two times the semiconductor contact pad surface area. The capsule is often made of ceramic or glass.

The invention further provides a method of encapsulating an electronic device comprising the steps of: providing a first fusible base substrate; providing a semiconductor device having an electrical contact pad; providing a fusible apertured plate positioned adjacent the first fusible base substrate to form a cavity having substantially the identical shape and size of the semiconductor device; placing the semiconductor within the cavity such that the device is substantially enclosed within the cavity; placing a second fusible base substrate over the apertured plate thus enclosing the semiconductor within the cavity; and fusing the first fusible base substrate, the fusible apertured plate and the second fusible base substrate into a unitized capsule which encapsulates the semiconductor device within the cavity with substantially no voids. The method may further include any of the following steps: heating the fusible base substrate, the fusible apertured plate and the second fusible base substrate to a predetermined temperature; placing the fusible base substrate, the fusible apertured plate and the second fusible base substrate in a reduced pressure environment; or applying pressure to the fusible base substrate, the fusible apertured plate and the second fusible base substrate to a predetermined pressure level.

Another embodiment of the present invention includes a method of encapsulating a semiconductor device comprising the step of encasing the semiconductor device having contact pads on a contact pad surface having a contact pad surface area in a substantially voidless capsule having electrical contact pads on an exterior mounting surface wherein the capsule mounting surface has a mounting area which is less than two times the semiconductor contact pad surface area.

The invention is further embodied as an IC package for a semiconductor device with at least three electrical connector pads. The package includes a body member having an interior chamber of identical shape and size of the semiconductor device which encapsulates the semiconductor device within the chamber with substantially no voids. At least three conducting paths extend from outside of the body member to at least three chamber electrical connector pads inside of the interior chamber which are in alignment with the electrical connector pads on the semiconductor device.

These and other characteristics of the present invention will become apparent through reference to the following detailed description of the preferred embodiments and accompanying drawings.

DETAILED DESCRIPTION OF THE PREFERRED EMBODIMENTS

For purposes of simplicity, this invention is described in terms of encapsulating a relatively simple electronic device, such as a power transistor. However, one familiar with the art will readily understand that other devices can be similarly encapsulated. The present invention provides a ceramic-glass IC package which has a device to package area ratio of less than 2:1. The package is generally comprised of a base substrate having a conducting die attach pad framed by a glass material; an apertured glass plate unit; a semiconductor device with solder connector bumps on one or more surfaces wherein the die is disposed within the aperture so that the solder connector bumps on the device make electrical contact with the conducting die attach pad on the base substrate; and a top die attach plate having conductor pads framed in a glass material so that some of the solder connector bumps on the device make electrical contact with the conductor pads in the top die attach plate. The direct connection of the contact pads or solder bumps on the die with the top and bottom die attach pads eliminates conventional wire bonding. This not only makes the assembly of the package easier, it greatly reduces the overall size of the package.

Figure 1:
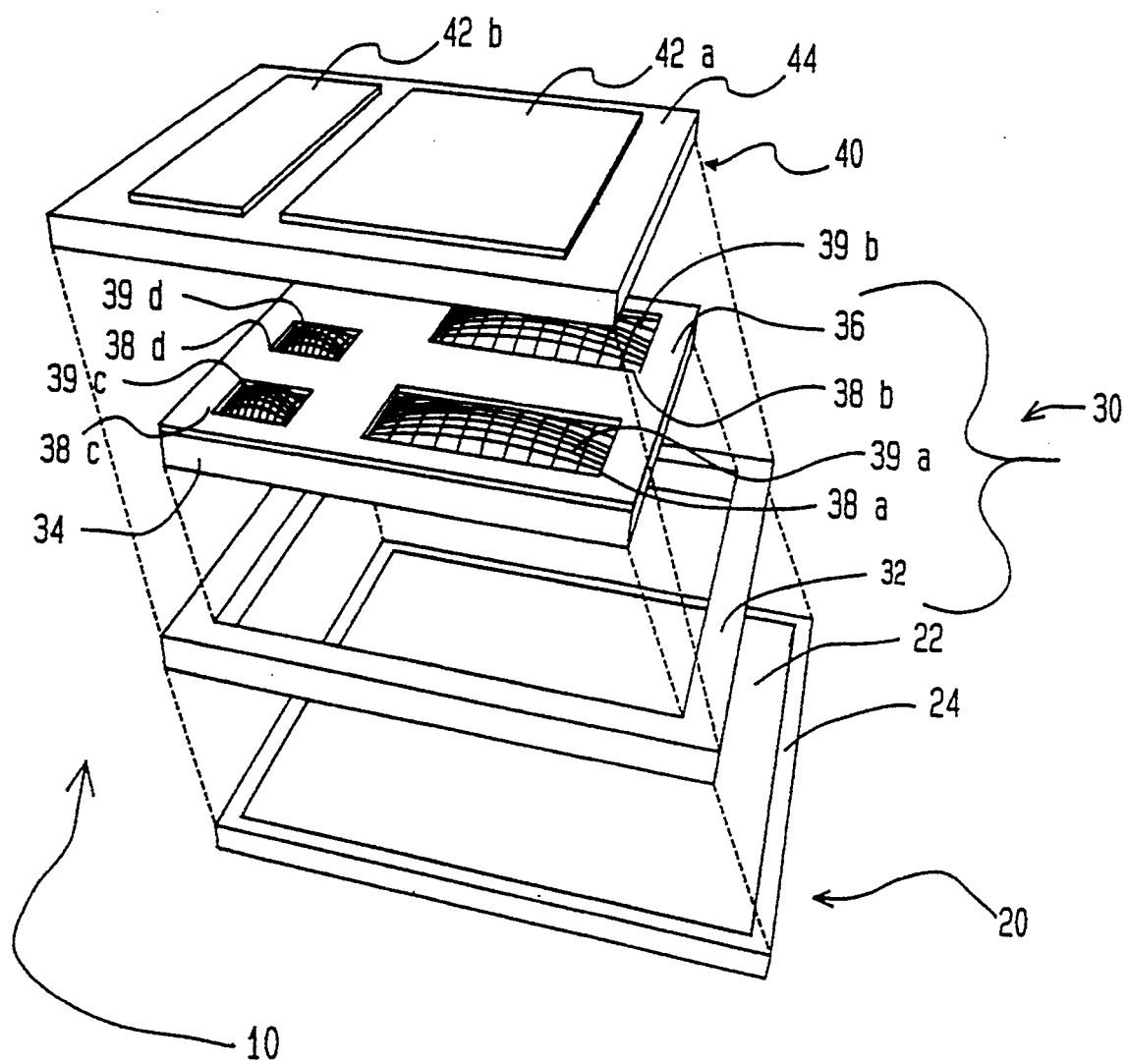
FIG. 1 is an exploded view of the construction of one embodiment of the present invention.

FIG. 1 shows an exploded view of one embodiment of an IC package 10 of the present invention. The package 10 comprises a bottom layer 20, a middle layer 30 and a top layer 40.

The bottom layer 20 comprises a die attach pad 22 and a die attach pad locator ring 24. Typically, the die attach pad 22 is constructed of a thermally and electrically conducting metal. The locator ring 24 is typically an electrical insulator, such as glass or ceramic. Layer 20 may comprise the two separate components 22 and 24 or a one piece assembly having the pad 22 and ring 24 fused into a unitary package. Alternatively, the bottom layer 20 may comprise a solid layer of insulator, for example ceramic, having a thin conducting film deposited on both sides to form the die attach pad 22. The films may be electrically connected by vias which pass through the insulator and are either filled or coated with a conducting material. Such interconnections are common in the art of ceramic packaging.

The middle layer 30 of package 10 comprises a die locator ring 32, similar in construction to the die attach pad locator ring 24. The die locator ring 32 may be made from an insulating material such as ceramic or glass. A second component of the middle layer 30 is a semiconductor die or chip 34. The die 34 has a solder mask 36 deposited on one surface which exposes solder connection areas 38 into which are placed solder bumps 39. For purposes of illustrating the invention, the die 34 is shown with four solder bumps 39a–39d, however, it will be understood that there can be any number of contact points and hence solder bumps 39 on the die 34.

The top layer 40 of the package assembly 10 is similar in construction to the bottom layer 20 in that it comprises die attach pads 42 and a die attach pad locator ring 44. As with the bottom layer 20, the die attach pads 42 are constructed of a thermally and electrically conducting metal. The locator ring 44 is typically an electrical insulator, such as glass or ceramic. Layer 40 may also comprise separate components 42 and 44 or a one piece assembly having the pads 42 and ring 44 fused into a unitary package. Additionally, the top layer 40 may comprise a solid layer of insulator having thin conducting films deposited on both sides. The films are then electrically connected by vias which pass through the insulator and are either filled or coated with a conducting material. Additionally, FIG. 1 shows multiple solder bumps, for example, 39a and 39b, making contact with a single die attach pad 42a. One skilled in the art will recognize that any combination of solder bump connections 39 with the external die attach pads 42 can be made depending upon the specific application. For example, in FIG. 1, each of the four solder bumps 39a–39d could be connected to a separate die attach pad thus providing four external electrical connection points.

While layers 20, 30 and 40 have been described as discrete layers, it will be recognized that the invention also includes embodiments where one of more layers are combined into fewer layers or separated into more layers. For example, the die locator ring 32, shown in layer 30, can also be incorporated into either layer 20 or layer 40. That is, locator ring 32 can be an integral part of the locator ring 24 or the locator ring 44. Other similar variations and modifications will be apparent to those skilled in the art and are included within the scope of the present invention.

The layers 20, 30 and 40 are assembled as shown in FIG. 1 and sealed into a unitary structure by fusing the locator ring portions of the individual layers together using conventional semiconductor glass/ceramic sealing techniques. For example, when two adjacent pieces of glass having a common contact surface are heated to a sufficiently elevated temperature, the glass becomes soft and the two pieces weld or fuse together. Likewise, when a piece of glass and a piece of ceramic share a common contact surface, elevated temperatures cause the glass to become soft and sometimes semi molten. The glass then "wets" the surface of the ceramic enabling the glass and ceramic to become welded or fused together without introducing any third material between the glass/ceramic interface. One particular piece of equipment often used in industry for fusing such materials is known in the art as an SST sealer which is commercially available from Scientific Sealing Technology. In this method of sealing, the stacked assembly is placed in a vacuum chamber. Any air contained in the chamber is pumped out. The assembly is then heated to a temperature at which the glass and/or ceramic components will fuse together. When the fusing temperature is reached, the chamber is backfilled and pressurized with an inert gas. The pressure serves two functions, first if there are any voids in the assembly, the pressure outside the assembly is greater than the pressure inside and thus tends to hold the assembly together during the fusing process. Second, any voids within the chamber may become filled with some of the inert gas prior to the sealing. This is advantageous, in that it makes it more difficult for air or other harmful gases to diffuse into the assembled and fused package. The combination of heat and pressure thus applied to the package not only fuses and seals the glass portions of the package together, it also completes the contact between the solder bumps 39 and the attach pads 42. If necessary, mechanical pressure may also be applied to the stacked package to facilitate the fusing of the layers. It may also be desirable to perform the sealing in air rather than in a vacuum or inert gas pressurized chamber. Many variations of the procedure for sealing may be used without departing from the spirit and intent of the invention.

Figure 2:
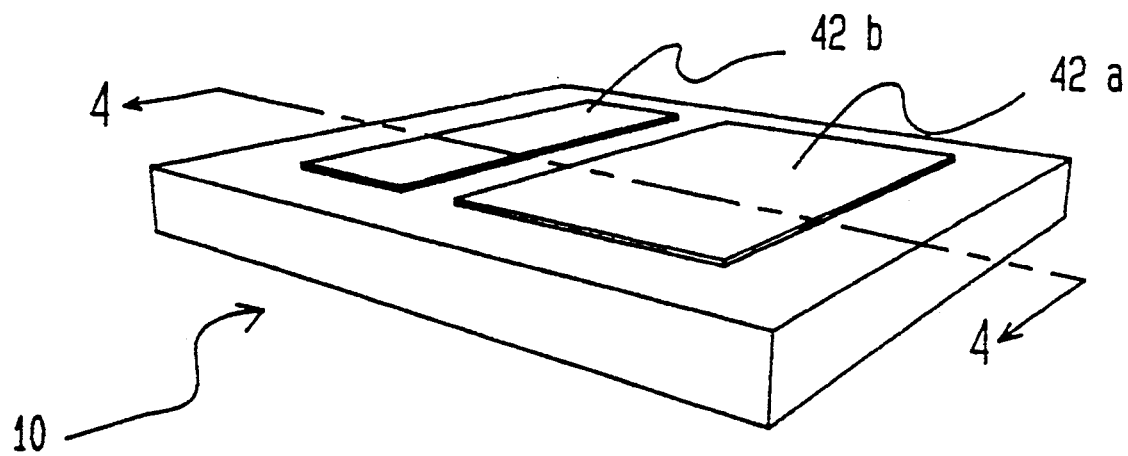
FIG. 2 is a perspective view of a completed assembly of the embodiment shown in FIG. 1 having exposed electrical contacts on two surfaces.

A perspective view of the assembled package 10 is shown in FIG. 2. The three layers 20, 30 and 40 are no longer readily distinguishable from the exterior of the finished package. The finished package appears as a solid glass package with contact pads 22 and 42 exposed.

Figure 3:
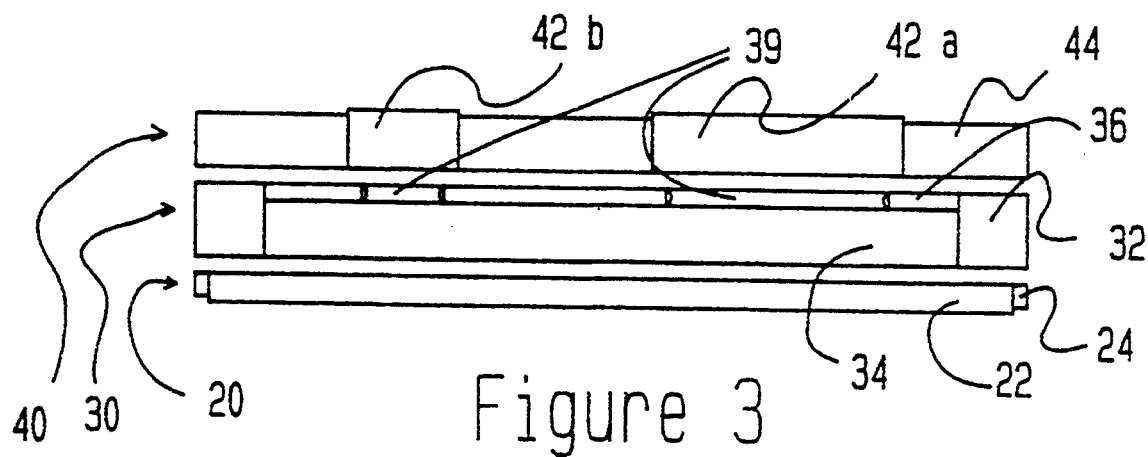
FIG. 3A is an exploded cross-sectional view of the embodiment shown in FIG. 2 before the layers comprising the assembly are fused together.
FIG. 3B is an exploded cross-sectional view of an embodiment similar to that shown in FIG. 2 having a solid bottom electrode shown before the layers comprising the assembly are fused together.
Figure 4:
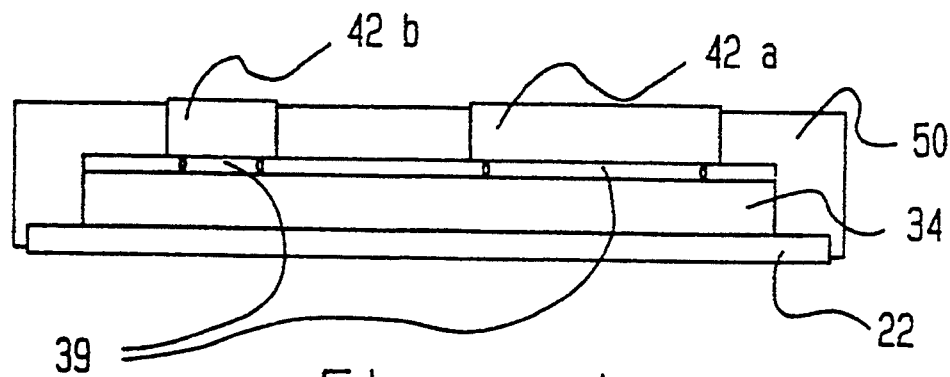
FIG. 4A is a cross-sectional view of the embodiment shown in FIG. 2 after the layers have been fused together.
FIG. 4B is a cross-sectional view of the embodiment shown in FIG. 3A after the layers have been fused together.

FIG. 3 shows an exploded cross-sectional view of the package 10 in FIG. 2 before the assembled package has been sealed or fused together. Thus, the individual layers 20, 30 and 40 are still distinguishable. The same assembly after fusing is shown in FIG. 4. As shown in FIG. 4, the portions of locator rings 24, 32 and 44 located around the periphery of the package are fused into a single unit 50 which completely surrounds the package with the exception of the contact pads 22 and 42 which are embedded in the glass. This forms a hermetically sealed package for the semiconductor device 34 within the package. The contact pads not only provide means to make electrical contact with the die 34, they also provide thermal paths for heat to escape from the device.

Figure 3A:
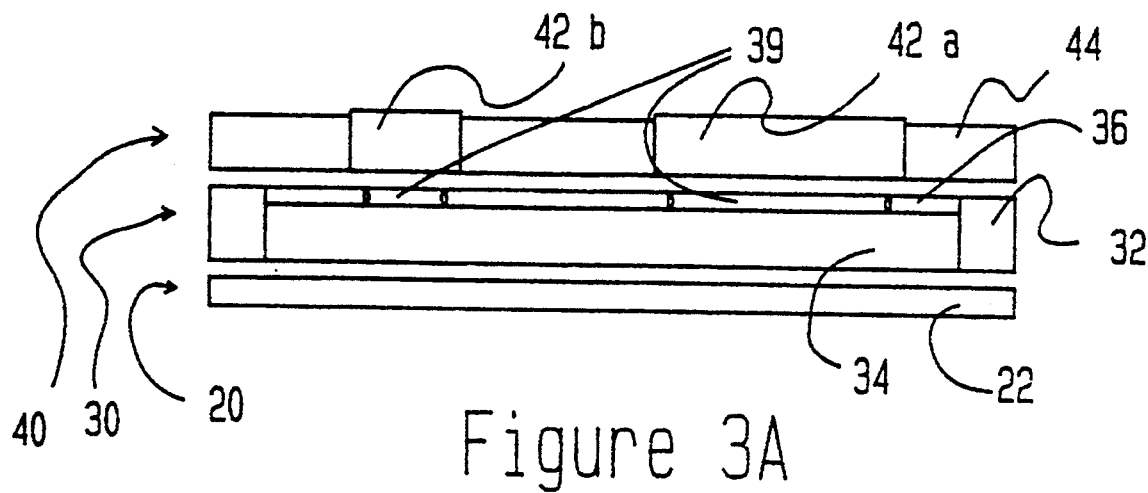
Figure 4A:
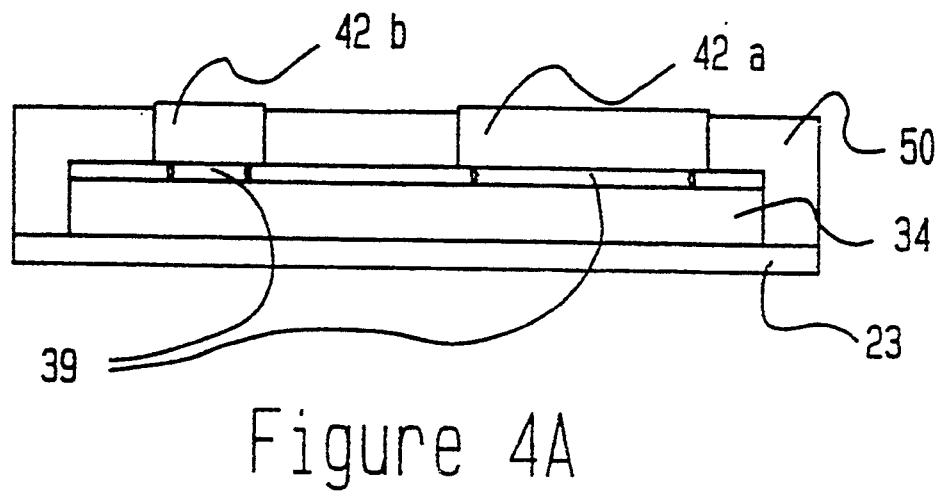

A modification of the embodiment shown in FIGS. 1-4 is shown in FIGS. 3A and 4A. In this modified embodiment, layer 20 comprises a conducting base substrate 23 which is fused directly to the locator ring 32. Conducting base substrate 23 may be a solid conducting plate or a plated insulator, as previously described in connection with the die attach pad 22. FIG. 3A shows an exploded cross-sectional view of this embodiment before the layers comprising the assembly are fused together. FIG. 4A shows a cross-sectional view of the embodiment shown in FIG. 3A after the layers have been fused together.

Figure 5:
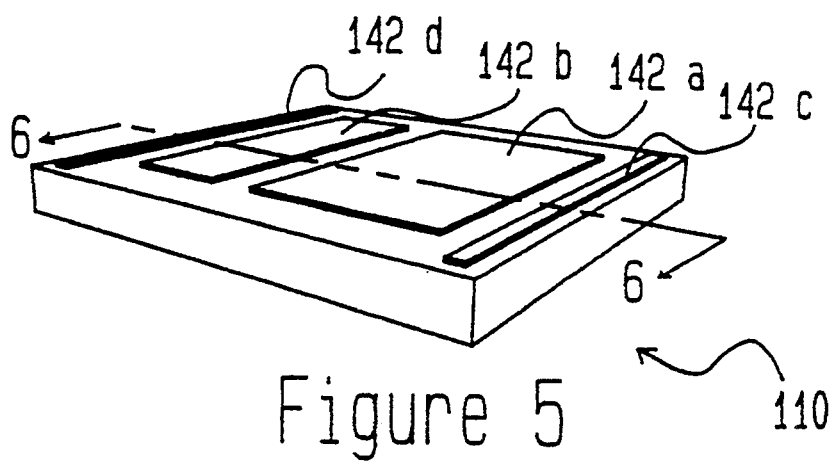
FIG. 5 is a perspective view of a completed assembly of a second embodiment of the invention having exposed electrical contacts on the top surface only.

FIG. 5 shows a perspective view of a second embodiment of an IC package 110 of the present invention having contact pads 142 on the top surface only. The IC package 110 is similar to the IC package 10 shown in FIGS. 1-4 in that it is also a layered structure. The major difference between the package 10 and the package 110 is the topside location of the contacts 142.

Figure 6A:
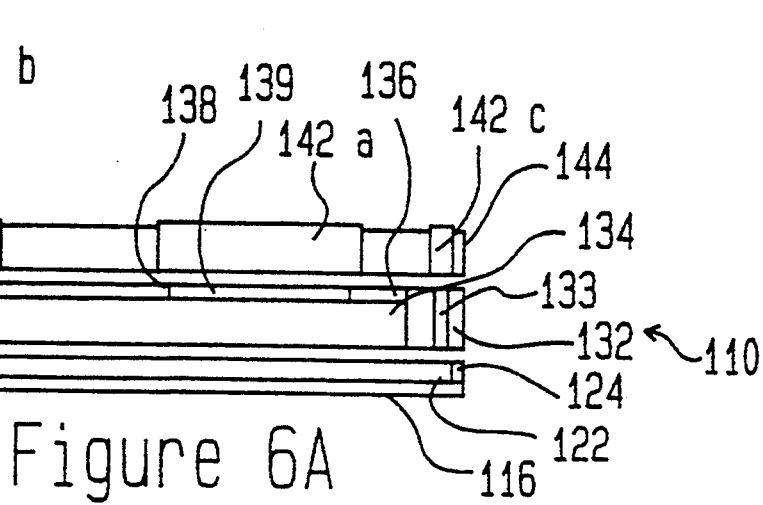
FIG. 6A is an exploded cross-sectional view of the embodiment shown in FIG. 5 before the layers comprising the assembly have been fused together.

An exploded cross-sectional view of the IC package 110 is shown in FIG. 6A. As shown is FIG. 6A, the individual layers comprising the IC package 110 have not yet been sealed or fused together and are still distinguishable.

The IC package 110 comprises a bottom layer 120 which comprises a bottom insulator 116 made of a fusible material such as glass or ceramic, a die attach pad 122 and a die attach pad locator ring 124. Typically, the die attach pad 122 is constructed of a thermally and electrically conducting metal. The locator ring 124 is typically an electrical insulator, such as glass or ceramic. The die attach pad 122 may comprise the two separate components 122 and 124 or a one piece assembly having the pad 122 and ring 124 fused into a unitary package. Alternatively, the die attach pad 122 may comprise a solid layer of insulator having a thin conducting film deposited on both sides. The conducting films may be electrically connected by vias which pass through the insulator and are either filled or coated with a conducting material, thus forming an electrical connection between the two conducting films.

The middle layer 130 of package 110 comprises a die locator ring 132, similar in construction to the die attach pad locator ring 124. Metalized vias 133 contact die attach pad 122 for bringing the internal contact from the attach pad 122 through the package 110 to the top surface. A second component of the middle layer 130 is a semiconductor die or chip 134. The die 134 has a solder mask 136 deposited on one surface which exposes solder connection areas 138 into which are placed solder bumps 139.

The top layer 140 of the package assembly 110 is similar in construction to that portion of the bottom layer 120 comprising the die attach pad 122 and locator ring 124 in that it comprises die attach pads 142 and a die attach pad locator ring 144. Vias 133 continue through the locator ring 144 to the upper surface of the package 110, thus making the bottom die attach pad 122 accessible from the top of the package via contacts 142c and 142d. As with the bottom layer 120, the die attach pads 142 are constructed of a thermally and electrically conducting metal. The locator ring 144 is typically an electrical insulator, such as glass or ceramic. Layer 140 may also comprise separate components 142 and 144 or a one piece assembly having the pads 142 and ring 144 fused into a unitary package. Additionally, the top layer 140 may comprise a solid layer of insulator having thin conducting films deposited on both sides. The films may be electrically connected by vias which pass through the insulator and are either filled or coated with a conducting material.

While layers 120, 130 and 140 have been described as discrete layers, it will be recognized that the invention also includes embodiments where one of more layers are combined into fewer layers or separated into more layers. For example, the die locator ring 132, shown in layer 130, can also be incorporated into either layer 120 or layer 140. That is, locator ring 132 can be an integral part of the locator ring 124 or the locator ring 144. Similarly, elements 142c, 142d, 133 and 122 may be combined and replaced by a single component in the shape of a "U" or "L" channel. Corresponding cutouts in layers through which the "U" of "L" channel pass accommodate this embodiment. Other similar variations and modifications will be apparent to those skilled in the art and are included within the scope of the present invention.

Figure 6B:
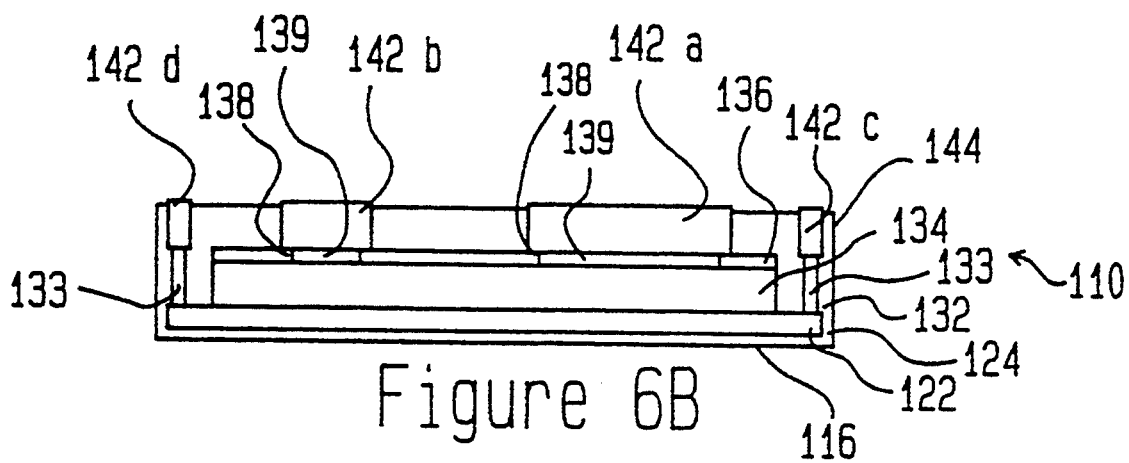
FIG. 6B is a cross-sectional view of the embodiment shown in FIGS. 5 and 6A after the layers have been fused together.

The layers 120, 130 and 140 are assembled as shown in FIG. 6A and sealed into a unitary structure as shown in FIG. 6B by fusing the glass portions of the individual layers together using conventional semiconductor glass/ceramic sealing techniques. One apparatus for performing this type of sealing is known in the art as an SST sealer and is commercially available from Scientific Sealing Technology- The sealing process is the same as previously described in the discussion of FIGS. 1-4.

Figure 7:
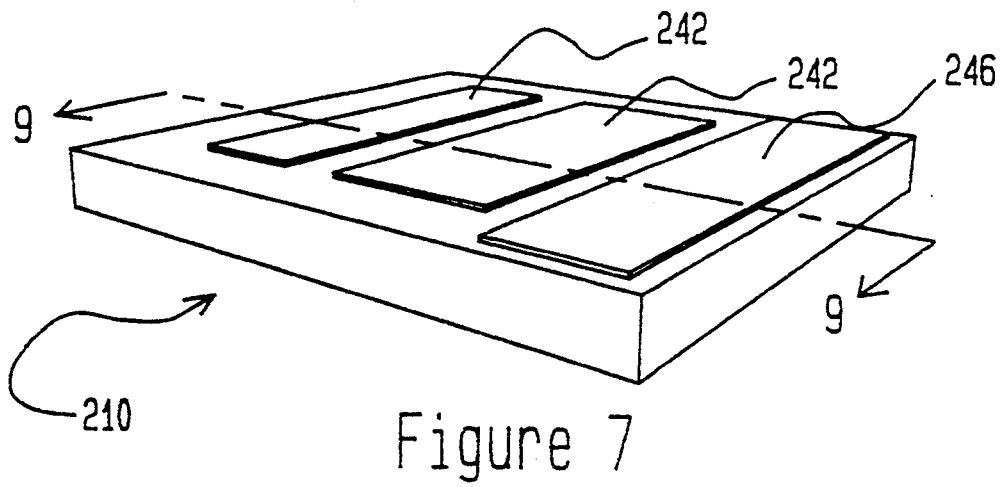
FIG. 7 is a perspective view of a completed assembly of a third embodiment of the invention having exposed electrical contacts on the top surface and an internal interconnecting circuit layer.
Figure 8:
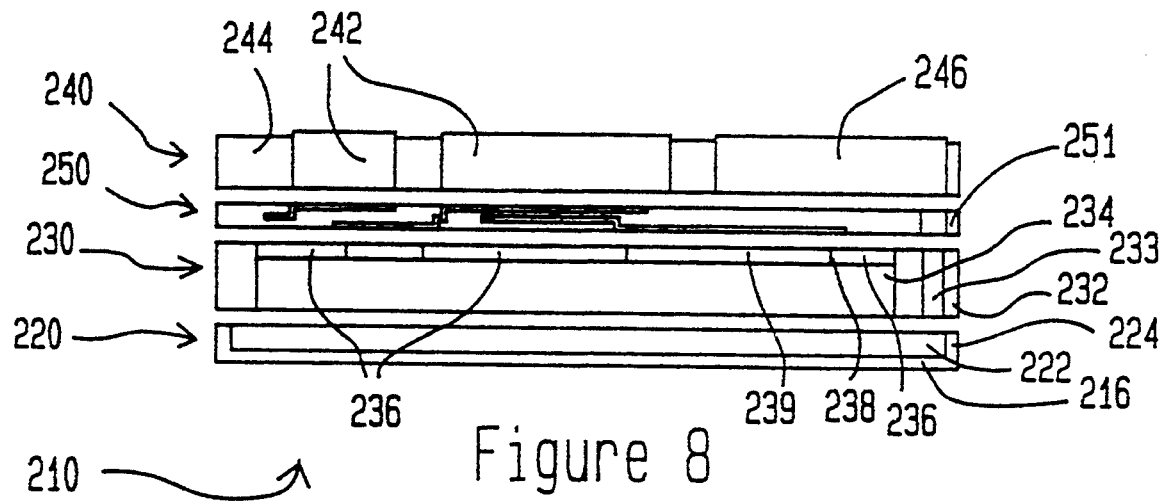
FIG. 8 is an exploded cross-sectional view of the embodiment shown in FIG. 7 before the layers comprising the assembly are fused together.

FIG. 7 shows a perspective view of a third embodiment of an IC package 210 of the present invention. IC package 210 may have contacts on both top and bottom surfaces as in the IC package 10 or on one surface only as in the IC package 110. Only the single surface version is shown in the figures, however, it will be understood that contacts could be on both surfaces- The major difference between IC package 210 and the packages 10 and 110 is that package 210 also includes an internal circuit layer 250 (see FIG. 8). The IC package 210 is similar to the IC packages 10 and 110 in that it is also a layered structure which is fused together in a single step. An exploded cross-sectional view of the IC package 210 is shown in FIG. 8. As shown is FIG. 8, the individual layers comprising the IC package 210 have not been sealed or fused together and are still distinguishable.

Referring to FIG. 8, the IC package 210 comprises a bottom layer 220 which comprises a bottom insulator 216 made of a fusible material such as glass or ceramic, a die attach pad 222 and a die attach pad locator ring 224. Typically, the die attach pad 222 is constructed of a thermally and electrically conducting metal. The locator ring 224 is typically an electrical insulator, such as glass or ceramic. The die attach pad 222 may comprise the two separate components 222 and 224 or a one piece assembly having the pad 222 and ring 224 fused into a unitary package. Alternatively, the die attach pad 222 may comprise a solid layer of insulator having a thin conducting film deposited on both sides. The films may be electrically connected by vias which pass through the insulator and are either filled or coated with a conducting material.

The middle layer 230 of package 210 comprises a die locator ring 232, similar in construction to the die attach pad locator ring 224. Metalized vias 233 contact the die attach pad 222 for bringing the external contact to the attach pad 222 out of the package 210 on the top. A second component of the middle layer 230 is a semiconductor die or chip 234. The die 234 has a solder mask 236 deposited on one surface which exposes solder connection areas 238 into which are placed solder bumps 239.

The circuit layer 250 is intermediate the chip 234 and the top layer 240 having the contact pads 242 and 246. Circuit layer 250 is a single or multiple layer circuit board which interconnects the contact areas 239 of the die 234 and the contacts 242 and 246. Circuit layer 250 generally comprises a glass or ceramic substrate with circuit traces formed in accordance with conventional procedures. Circuit layer 250 has been described as a separate layer for clarity of illustration, however it is easily incorporated into layer 240. That is, single or multiple layers of circuit traces are deposited on the surface of the layer 240 between layers 240 and 230, thus making the circuit layer 250 an integral part of the layer 240.

The top layer 240 of the package assembly 210 is similar in construction to that portion of the bottom layer 220 comprising the die attach pad 222 and locator ring 224 in that it comprises die attach pads 242, 246 and a die attach pad locator ring 244. Vias 233 continue through material 251 to make contact with attach pad 246, thus making the bottom die attach pad 222 accessible from the top of the package via contact 246. As with the bottom layer 220, the die attach pads 242 are constructed of a thermally and electrically conducting metal. The locator ring 244 is typically an electrical insulator, such as glass or ceramic. Layer 240 may also comprise separate components 242 and 244 or a one piece assembly having the pads 242 and ring 244 fused into a unitary package. Additionally, the top layer 240 may comprise a solid layer of insulator having thin conducting films deposited on both sides. The films may be electrically connected by vias which pass through the insulator and are either filled or coated with a conducting material.

While layers 220, 230, 240 and 250 have been described as discrete layers, it will be recognized that the invention also includes embodiments where one of more layers are combined into fewer layers or separated into more layers. The combining of layers 240 and 250 into a single layer has previously been discussed. Additionally, the die locator ring 232, shown in layer 230, can also be incorporated into either layer 220, 240 or 250. That is, locator ring 232 can be an integral part of the locator ring 224 or the locator ring 244 or the circuit layers 250. Other similar variations and modifications will be apparent to those skilled in the art and are included within the scope of the present invention. The layers 220, 230, 240 and 250 are assembled as shown in FIG. 8 and sealed into a unitary structure by fusing the glass portions of the individual layers together using conventional semiconductor glass/ceramic sealing techniques. One apparatus for performing this type of sealing is known in the art as an SST sealer and is commercially available from Scientific Sealing Technology. The sealing process is the same as previously described in the discussion of FIGS. 1–4.

Figure 9:
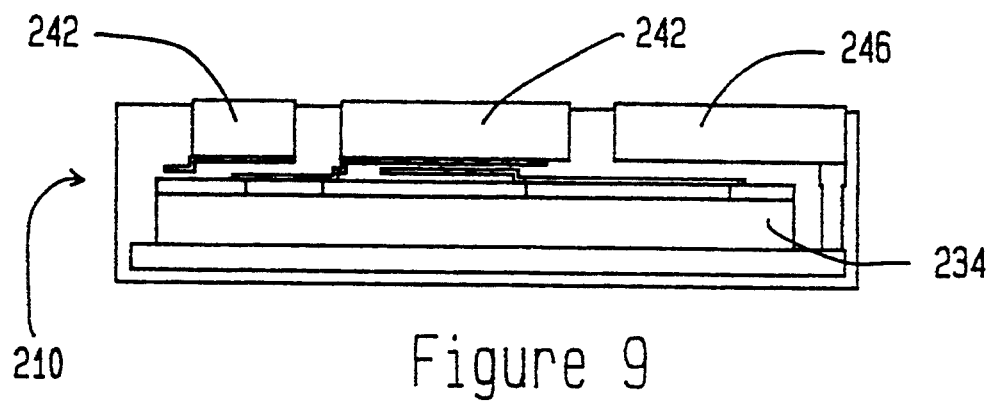
FIG. 9 is a cross-sectional view of the embodiment shown in FIGS. 7 and 8 after the layers have been fused together.

FIG. 9 shows the IC package 210 with intermediate circuit layer 250 after the layers 220, 230, 240 and 250 have been fused into a single unit, thus creating an hermetically sealed IC package for the chip 234 and circuitry 250 having a footprint not substantially larger than the die 234.

It will be understood that the apparatus and method of the present invention for an IC package may be employed with any type of semiconductor device including integrated circuits, LSI's, transistors, diodes, etc.. Thus, there are numerous other embodiments of the IC package which will be obvious to one skilled in the art, including but not limited to changes in the dimensions of the IC package, location of external contacts, order of the layers, materials used to make the various layers of the package, methods and materials for sealing the package, etc. Additionally, one skilled in the art will realize that materials other than glass and ceramic could be used and that some embodiments of the invention may not be hermetically sealed due to the types of materials used in the construction. The apparatus and method of the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. An electronic package comprising:

a first base substrate;

an apertured plate, said apertured plate positioned adjacent said first base substrate to form a cavity, wherein said first base substrate and said apertured plate are fusible directly to each other;

a semiconductor device having an electrical contact pad, said device disposed within said cavity such that said device is substantially enclosed within said cavity, said cavity enclosing said semiconductor device being substantially voidless;

a second base substrate which is directly fusible to said apertured plate, said second base substrate encapsulating said semiconductor device;

a first substrate conductor path which extends from a cavity conductor pad through said first base substrate to an exterior conductor pad, said cavity conductor pad located on a first surface of said first base substrate, said exterior conductor pad located on a second surface of said first base substrate; and a conducting interconnector between said device electrical contact pad and said cavity conductor pad, thus forming an electrical connection between said semiconductor device and said exterior conductor pad.

2. An apparatus as defined in claim 1 wherein said first base substrate further comprises:
   a ceramic substrate;
   a film of conducting material deposited on said first surface of said first base substrate to form said exterior conductor pad;
   a film of conducting material deposited on said second surface of said first base substrate to form said cavity conductor pad; and
   a conducting via passing through said first base substrate from said first surface to said second surface electrically interconnecting said exterior conductor pad to said cavity conductor pad.

3. An apparatus as defined in claim 1 wherein said first base substrate further comprises:
   a conducting substrate; and
   a ceramic substrate having an aperture into which said conducting substrate is fused.

4. An apparatus as defined in claim 1 wherein said first base substrate further comprises:
   a conducting substrate; and
   a glass substrate having an aperture into which said conducting substrate is fused.

5. An apparatus as defined in claim 1 further comprising a layer of circuitry interposed between said semiconductor device and said exterior conductor pad.

6. An apparatus as defined in claim 1 wherein said second base substrate further comprises a second substrate conductor path which extends from a second cavity conductor pad through said second base substrate to a second exterior conductor pad.

7. An electronic package comprising:
   a first base substrate having an aperture which defines a cavity;
   a semiconductor device having an electrical contact pad, said device disposed within said cavity such that said device is substantially enclosed within said cavity leaving substantially no voids in said cavity;
   a second base substrate which is directly fusible to said first base substrate, said second base substrate encapsulating said semiconductor device;
   a substrate conductor path which extends from a cavity conductor pad through said first base substrate to an exterior conductor pad; and
   a conducting interconnector sandwiched between said device electrical contact pad and said cavity conductor pad, thus forming an electrical connection between said semiconductor device and said exterior conductor pad.

8. An apparatus as defined in claim 7 wherein said first base substrate further comprises:
   a ceramic substrate;
   a film of conducting material deposited on a first surface of said substrate to form said exterior conductor pad;
   a film of conducting material deposited on a second surface of said substrate to form said cavity conductor pad; and
   a conducting via passing through said substrate from said first surface to said second surface electrically interconnecting said exterior conductor pad to said cavity conductor pad.

9. An apparatus as defined in claim 7 further comprising a layer of circuitry interposed between said semiconductor device and said external conductor pad.

10. An apparatus as defined in claim 7 wherein said second base substrate further comprises a second substrate conductor path which extends from a second cavity conductor pad through said second base substrate to an exterior conductor pad.

11. An electronic package comprising:
    a first base substrate having an aperture which defined a cavity;
    a semiconductor device having an electrical contact pad, said device disposed within said cavity such that said device is substantially enclosed within said cavity leaving substantially no voids in said cavity;
    a second base substrate which is directly fusible to said first base substrate, said second base substrate encapsulating said semiconductor device;
    a substrate conductor path which extends from a cavity conductor pad through said second base substrate to an exterior conductor pad; and
    a conducting interconnector sandwiched between said device electrical contact pad and said cavity conductor pad, thus forming an electrical connection between said semiconductor device and said exterior conductor pad.

12. An apparatus as defined in claim 11 wherein said second base substrate further comprises:
    a ceramic substrate;
    a film of conducting material deposited on a first surface of said substrate to form said exterior conductor pad;
    a film of conducting material deposited on a second surface of said substrate to form said cavity conductor pad; and
    a conducting via passing through said substrate from said first surface to said second surface electrically interconnecting said exterior conductor pad to said cavity conductor pad.

13. An apparatus as defined in claim 11 further comprising a layer of circuitry interposed between said semiconductor device and said external conductor pad.

14. An apparatus as defined in claim 11 wherein said first base substrate further comprises a second substrate conductor path which extends from a second cavity conductor pad through said first base substrate to a second exterior conductor pad.

15. An IC package comprising:
    a semiconductor device having an electrical connector pad;
    a body member, said body member comprising:
      an interior chamber having substantially the identical shape and size of said semiconductor device for encapsulating said semiconductor device within said chamber with substantially no voids; and
      a conducting path extending from an exterior surface of said body member to a chamber electrical connector pad on an interior surface of said interior chamber; and
      an conductive material sandwiched between said chamber electrical connector pad on said interior surface of said interior chamber and said electrical connector pad on said semiconductor device.

16. An IC package as defined in claim 15 further comprising a circuit member interposed between said semiconductor device electrical connector pad and said conducting path extending from said body member exterior surface.

17. An IC package comprising a semiconductor device having contact pads on a contact pad surface having a contact pad surface area, said semiconductor device encased in a voidless capsule having electrical contact pads on an exterior mounting surface wherein said capsule mounting surface has a mounting area which is less than two times said semiconductor contact pad surface area.

18. An IC package as defined in claim 17 wherein said voidless capsule further comprises a ceramic wall.

19. An IC package as defined in claim 17 wherein said voidless capsule further comprises a glass wall.

20. An IC package comprising:
a semiconductor device having at least three electrical connector pads; and
a body member, said body member comprising:
   an interior chamber having substantially the identical shape and size of said semiconductor device for encapsulating said semiconductor device within said chamber with substantially no voids; and
   at least three conducting paths extending from outside of said body member to at least three chamber electrical connector pads inside of said interior chamber which are in alignment with said electrical connector pads on said semiconductor device.

* * * * *